US011736000B2

(12) United States Patent
Nishio

(10) Patent No.: US 11,736,000 B2
(45) Date of Patent: Aug. 22, 2023

(54) POWER CONVERTER WITH THERMAL RESISTANCE MONITORING

(71) Applicant: FUJI ELECTRIC CO., LTD., Kawasaki (JP)

(72) Inventor: Haruhiko Nishio, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 195 days.

(21) Appl. No.: 17/237,147

(22) Filed: Apr. 22, 2021

(65) Prior Publication Data

US 2021/0384819 A1 Dec. 9, 2021

(30) Foreign Application Priority Data

Jun. 5, 2020 (JP) .................................. 2020-098911

(51) Int. Cl.
*H02M 1/32* (2007.01)
*H03K 17/082* (2006.01)
*H03K 17/08* (2006.01)

(52) U.S. Cl.
CPC ........ *H02M 1/327* (2021.05); *H03K 17/0822* (2013.01); *H03K 2017/0806* (2013.01)

(58) Field of Classification Search
CPC .. G01K 1/12; G01K 7/16; G01K 7/22; G01K 7/42; G01K 7/02; H02M 1/32; H02M 1/327; H02M 7/538; H02M 2001/327; H02M 3/158; H02M 3/1584; H02M 3/285; H02M 2/33561; H02M 7/49; H02M 1/045; H02M 7/006; H02M 7/06; H02M 7/068; H02M 7/153; H02M 7/10; H02M 1/088; H02M 7/103; H02M 7/106; H02M 7/19; H02M 7/08; H02M 7/17; H02M 2001/007; H02M 7/493; H02M 7/53806;

(Continued)

(56) References Cited

U.S. PATENT DOCUMENTS 6,839,213 B2 * 1/2005 Mori .................. H02M 1/00 361/103
7,583,043 B2 * 9/2009 Chung .................. F04D 27/004 318/729

(Continued)

FOREIGN PATENT DOCUMENTS

JP H07-135731 A 5/1995
JP 3788334 B2 6/2006

(Continued)

*Primary Examiner* — Thienvu V Tran
*Assistant Examiner* — Nusrat Quddus
(74) *Attorney, Agent, or Firm* — Rabin & Berdo, P.C.

(57) ABSTRACT

A power converter including a control circuit configured to output a control signal, and a semiconductor module. The semiconductor module includes a semiconductor chip, a switching device provided on the semiconductor chip, the switching device being configured to be turned on and off in response to the control signal, and a first temperature sensor configured to detect a temperature of the semiconductor chip. The control circuit is configured to monitor a thermal resistance of the semiconductor module based on a first temperature detected by the first temperature sensor, a second temperature corresponding to a temperature of the semiconductor module, and a power consumption of the switching device.

13 Claims, 9 Drawing Sheets

(58) Field of Classification Search
CPC ............... H02M 7/5381; H02M 7/483; H02M 7/538466; H02M 7/53871; H02M 7/53873; H02M 7/53875; H02M 1/084; H02M 1/0845; H02M 5/42; H02M 5/453; H02M 7/7575; H02M 5/458; H02M 5/45; H02M 5/4585; H02M 5/4505; H02M 5/451; H02M 5/452; H02M 5/447; H02M 5/456; H02M 1/12; H02M 1/4266; H02M 2001/123; H02M 3/073; H02M 3/10; H02M 3/135; H02M 3/137; H02M 3/28; H02M 3/315; H02M 3/3155; H02M 3/325; H02M 3/335; H02M 7/515; H02M 7/521; H02M 7/53; H02M 7/537; H02M 7/5383; H02M 7/53862; H02M 7/5387; H02M 7/757; H02M 7/79; H02M 3/337; H02M 3/338; H02M 3/3382; H02M 3/3384; H02M 7/53832; H02M 7/53835; H02M 7/487; H02M 7/539; H02M 7/23; H02M 7/217; H02M 7/21; H02M 7/12; H02M 7/04; H02M 7/00; H02P 29/68; H01L 27/024; H02H 7/12; H02H 7/268; H02H 7/261; H03K 17/0822; H02J 3/46; H02J 3/38; H02J 3/36; H02J 3/01
USPC .................................................. 702/130, 138
See application file for complete search history.

(56) References Cited

U.S. PATENT DOCUMENTS

| | | | | |
|---|---|---|---|---|
| 8,602,645 | B2* | 12/2013 | Miyamoto | G01K 7/42 323/907 |
| 8,952,624 | B2* | 2/2015 | Kim | H05B 45/382 315/185 S |
| 2005/0204761 | A1* | 9/2005 | Karikomi | G01K 7/425 374/E7.043 |
| 2007/0200004 | A1* | 8/2007 | Kasper | F24F 11/30 236/44 C |
| 2008/0041076 | A1* | 2/2008 | Tutunoglu | F24F 11/84 62/181 |
| 2008/0262750 | A1* | 10/2008 | Ibori | H02M 5/451 702/34 |
| 2009/0046405 | A1* | 2/2009 | Ichikawa | H03K 17/0822 361/103 |
| 2009/0051307 | A1* | 2/2009 | Katsuyama | H03K 17/18 318/472 |
| 2009/0167414 | A1* | 7/2009 | Jansen | G01K 1/14 327/513 |
| 2010/0080024 | A1* | 4/2010 | Wei | H03K 17/0828 363/74 |
| 2012/0049932 | A1* | 3/2012 | Hokabira | H03K 17/08 327/478 |
| 2012/0217795 | A1* | 8/2012 | Hasegawa | H02M 7/48 307/9.1 |
| 2012/0250385 | A1* | 10/2012 | Taki | G01K 7/00 327/131 |
| 2012/0255318 | A1* | 10/2012 | Kido | F25B 31/006 62/126 |
| 2012/0281433 | A1* | 11/2012 | Yamanaka | G01R 31/40 363/13 |
| 2013/0015799 | A1* | 1/2013 | Ayano | B60L 3/003 318/430 |
| 2013/0135906 | A1* | 5/2013 | Kawamura | H02P 27/085 363/40 |
| 2014/0049870 | A1* | 2/2014 | Fujikawa | H02M 1/32 361/101 |
| 2014/0077888 | A1* | 3/2014 | Iwasa | H03L 1/022 331/66 |
| 2014/0084830 | A1* | 3/2014 | Djonga | G01K 7/427 318/400.42 |
| 2014/0361721 | A1* | 12/2014 | Yamaguchi | H02P 29/68 318/472 |
| 2014/0362490 | A1* | 12/2014 | Maekawa | H03K 17/0828 361/103 |
| 2015/0202236 | A1* | 7/2015 | Kuchina | A61K 8/99 424/93.4 |
| 2015/0204730 | A1* | 7/2015 | Daitoku | H02M 1/32 374/178 |
| 2015/0205314 | A1* | 7/2015 | Hayashi | G05F 1/56 323/217 |
| 2015/0211938 | A1* | 7/2015 | Imakiire | G01K 7/22 702/133 |
| 2016/0258821 | A1* | 9/2016 | Tsurumaru | G01K 7/42 |
| 2016/0276947 | A1* | 9/2016 | Wu | H02M 5/22 |
| 2016/0356655 | A1* | 12/2016 | Tsurumaru | H01L 29/7395 |
| 2016/0372454 | A1* | 12/2016 | Minagawa | H01L 27/0255 |
| 2017/0003337 | A1* | 1/2017 | Bito | H03K 19/018507 |
| 2017/0093390 | A1* | 3/2017 | Tsurumaru | H03K 17/08128 |
| 2017/0299443 | A1 | 10/2017 | Yang | |
| 2018/0048141 | A1* | 2/2018 | Suzuki | H02M 1/32 |
| 2018/0108957 | A1* | 4/2018 | Sheng | G05D 23/19 |
| 2018/0172522 | A1* | 6/2018 | Lee | G01K 7/01 |
| 2020/0204061 | A1* | 6/2020 | Minesawa | G01K 7/01 |
| 2021/0021227 | A1* | 1/2021 | Kimura | H02M 1/32 |
| 2021/0293860 | A1* | 9/2021 | Hou | G01R 19/0092 |

FOREIGN PATENT DOCUMENTS

| | | |
|---|---|---|
| JP | 2006-238546 A | 9/2006 |
| JP | 2008-131722 A | 6/2008 |
| JP | 2009-043780 A | 2/2009 |
| JP | 4677756 B2 | 4/2011 |
| JP | 2017-195758 A | 10/2017 |
| JP | 2018-096970 A | 6/2018 |

* cited by examiner

POWER CONVERTER WITH THERMAL RESISTANCE MONITORING

CROSS-REFERENCE TO RELATED APPLICATION

The present application claims priority pursuant to 35 U.S.C. § 119 from Japanese patent application number 2020-098911 filed on Jun. 5, 2020, the entire disclosure of which is hereby incorporated by reference herein.

BACKGROUND

Technical Field

The present disclosure relates to a power converter.

Description of the Related Art

A semiconductor module for converting and/or controlling power commonly includes a bridge circuit and/or an inverter circuit that includes a switching device such as an insulated gate bipolar transistor (IGBT). Such a semiconductor module is made of materials with different coefficients of thermal expansion, such as semiconductor, metal, and resin, and thus thermal resistance thereof varies with deterioration thereof caused by thermal stress.

For example, Japanese Patent Application Publication No. 2017-195758 discloses a technique for detecting the junction temperature of a switching device based on a temperature detected by a temperature sensor near the switching device and a known thermal resistance of a semiconductor module.

In addition, Japanese Patent Application Publication No. 2006-238546 discloses a technique for directly detecting the junction temperature of a switching device with a temperature sensor provided on a semiconductor chip having the switching device provided thereon.

However, according to the technique disclosed in Japanese Patent Application Publication No. 2017-195758, determination on deterioration of the semiconductor module is based on the known thermal resistance, and thus change in the thermal resistance caused by deterioration is not considered. Accordingly, the accuracy of the measurement of the junction temperature of the switching device degrades over time.

In addition, according to the technique disclosed in Japanese Patent Application Publication No. 2006-238546, it is possible to directly monitor the junction temperature of the switching device, but impossible to monitor the thermal resistance of the semiconductor module that changes over time.

The present disclosure is directed to provision of a power converter capable of monitoring a thermal resistance of a semiconductor module that changes over time.

SUMMARY

An aspect of the present disclosure is a power converter comprises: a control circuit configured to output a control signal; and a semiconductor module including a semiconductor chip, a switching device provided on the semiconductor chip, the switching device being configured to be turned on and off in response to the control signal, and a first temperature sensor configured to detect a temperature of the semiconductor chip, wherein the control circuit is configured to monitor a thermal resistance of the semiconductor module based on a first temperature detected by the first temperature sensor, a second temperature corresponding to a temperature of the semiconductor module, and a power consumption of the switching device. Other features of the present disclosure will become apparent from the descriptions of the present specification.

DETAILED DESCRIPTION

<Overview of Power Converter>

Figure 1:
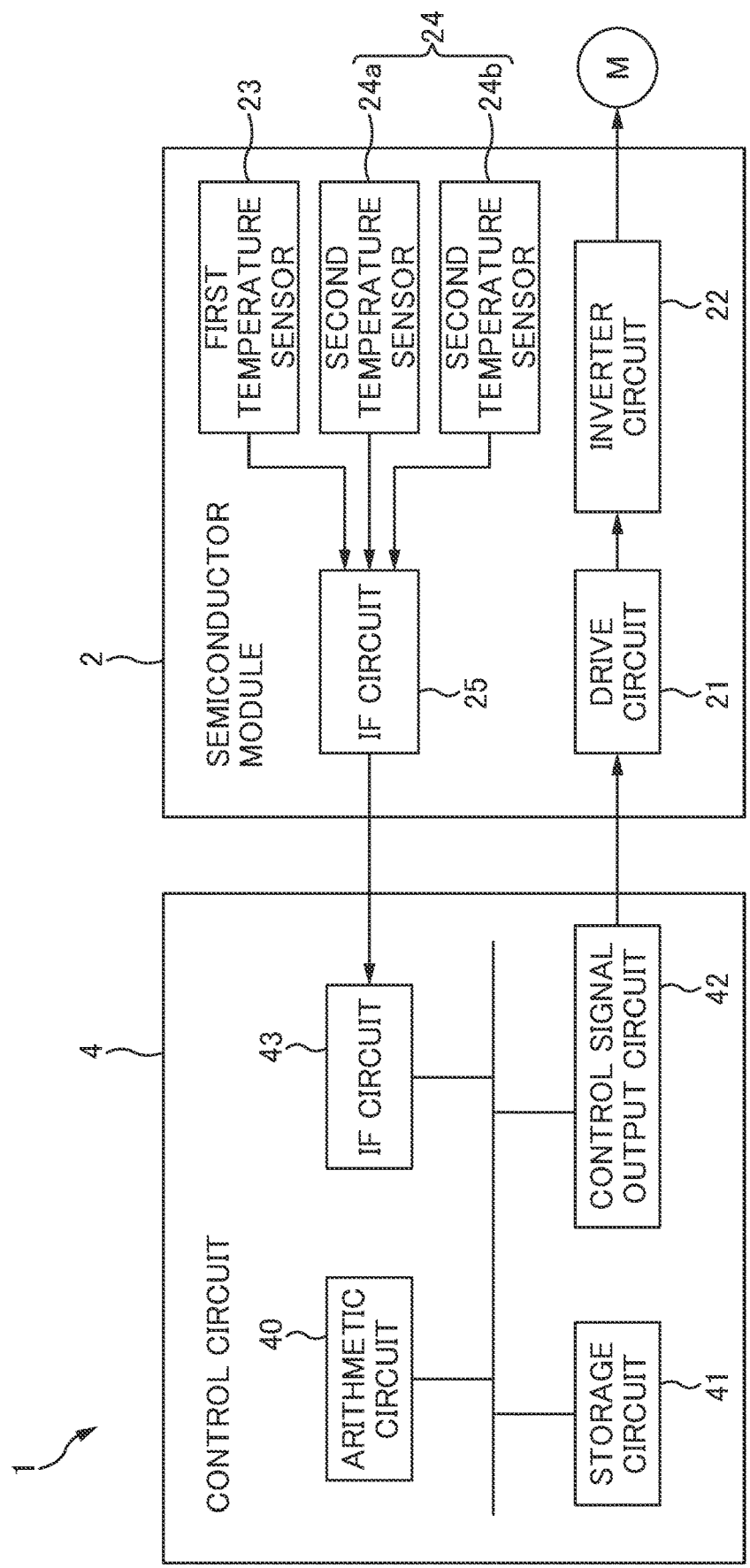
FIG. 1 is a diagram illustrating an example of a configuration of a power converter.

An overview of a power converter 1 according to an embodiment of the present disclosure will be described with reference to FIG. 1. FIG. 1 is a diagram illustrating an example of a configuration of the power converter 1. The power converter 1 according to an embodiment of the present disclosure is a device that generates an alternating-current (AC) voltage from a direct-current (DC) voltage and controls the rotational speed of a three-phase motor M, and comprises a semiconductor module 2 and a control circuit 4.

The semiconductor module 2 includes a drive circuit 21, an inverter circuit 22, a first temperature sensor 23, a second temperature sensor 24, and an interface (IF) circuit 25.

The drive circuit 21 directly controls the driving of the inverter circuit 22. Specifically, the drive circuit 21 controls on and off of switching devices configuring the inverter circuit 22 by pulse width modulation (PWM), in response to control signals described later.

The inverter circuit 22 drives a load such as the three-phase motor M and/or the like. The inverter circuit 22 according to an embodiment of the present disclosure is a voltage-type three-phase PWM inverter circuit (described later). The inverter circuit 22 includes a plurality of switching devices and the like. Each of the switching devices is provided on a semiconductor chip described later and is turned on and off in response to a control signal from the control circuit 4.

The first temperature sensor 23 is provided to detect the temperature of the semiconductor chip. The first temperature sensor 23 is provided on the semiconductor chip. In an embodiment of the present disclosure, a PN diode is used as the first temperature sensor 23. The PN diode is formed on the semiconductor chip in the process of manufacturing the semiconductor chip. Alternatively, for example, a thermistor, a thermocouple, or the like provided on the semiconductor chip may be used as the first temperature sensor 23.

The second temperature sensor 24 is provided to detect the temperature of the semiconductor module 2. The second temperature sensor 24 is provided at a distance from the semiconductor chip. As will be described later, the power converter 1 according to an embodiment of the present disclosure calculates and monitors the thermal resistance of a desired path starting from the semiconductor chip. The second temperature sensor 24 is provided at the endpoint of the desired path. For example, a PN diode, a thermistor, a thermocouple, or the like can be used as the second temperature sensor 24.

At least one second temperature sensor 24 is provided. In an embodiment of the present disclosure, two second temperature sensors 24a and 24b are provided. In other words, the power converter 1 according to an embodiment of the present disclosure can calculate and monitor the thermal resistances of two paths.

The IF circuit 25 outputs various signals to the control circuit 4. Although details will be described later, the various signals include, for example, signals indicative of the temperature detected by the first temperature sensor 23 and the temperature detected by the second temperature sensor 24 and signals indicative of currents flowing through the switching devices of the inverter circuit 22.

[Control Circuit]

The control circuit 4 outputs, to the drive circuit 21, a control signal for controlling the inverter circuit 22 provided in the semiconductor module 2. The control circuit 4 is, for example, a microcomputer, and includes an arithmetic circuit 40, a storage circuit 41, a control signal output circuit 42, and an IF circuit 43.

The arithmetic circuit 40 is, for example, a central processing unit (CPU), and executes a program for monitoring thermal resistance stored in the storage circuit 41, to thereby implement various functions in the arithmetic circuit 40.

The storage circuit 41 is memory including a read-only memory (ROM) and a random-access memory (RAM) and storing various kinds of data. Although details will be described later, examples of what is stored in the storage circuit 41 include information in the specification of the semiconductor module 2, the initial value of a thermal resistance $R_\theta$, a first threshold $Th_1$, a second threshold $Th_2$, the thermal resistance monitoring program, and the like.

The control signal output circuit 42 outputs a control signal for adjusting the rotational speed of the three-phase motor M with respect to the drive circuit 21 of the semiconductor module 2, in response to a received instruction signal (not shown). Note that the control signal from the control signal output circuit 42 is a PWM signal. Then, in an embodiment of the present disclosure, the larger the duty cycle (or the duty factor) of the PWM signal, the higher the rotational speed of the three-phase motor M.

Although details will be described later, the inverter circuit 22 according to an embodiment of the present disclosure includes six switching devices. Accordingly, the control signal output circuit 42 outputs six PWM signals as control signals so as to be able to control on and off of the six switching devices, respectively.

The interface (IF) circuit 43 receives various signals from the semiconductor module 2 and outputs the various signals to the control circuit 4. Examples of the various signals include the temperature detected by the first temperature sensor 23, the temperature detected by the second temperature sensor 24, currents flowing through the switching devices, and the like.

Figure 2:
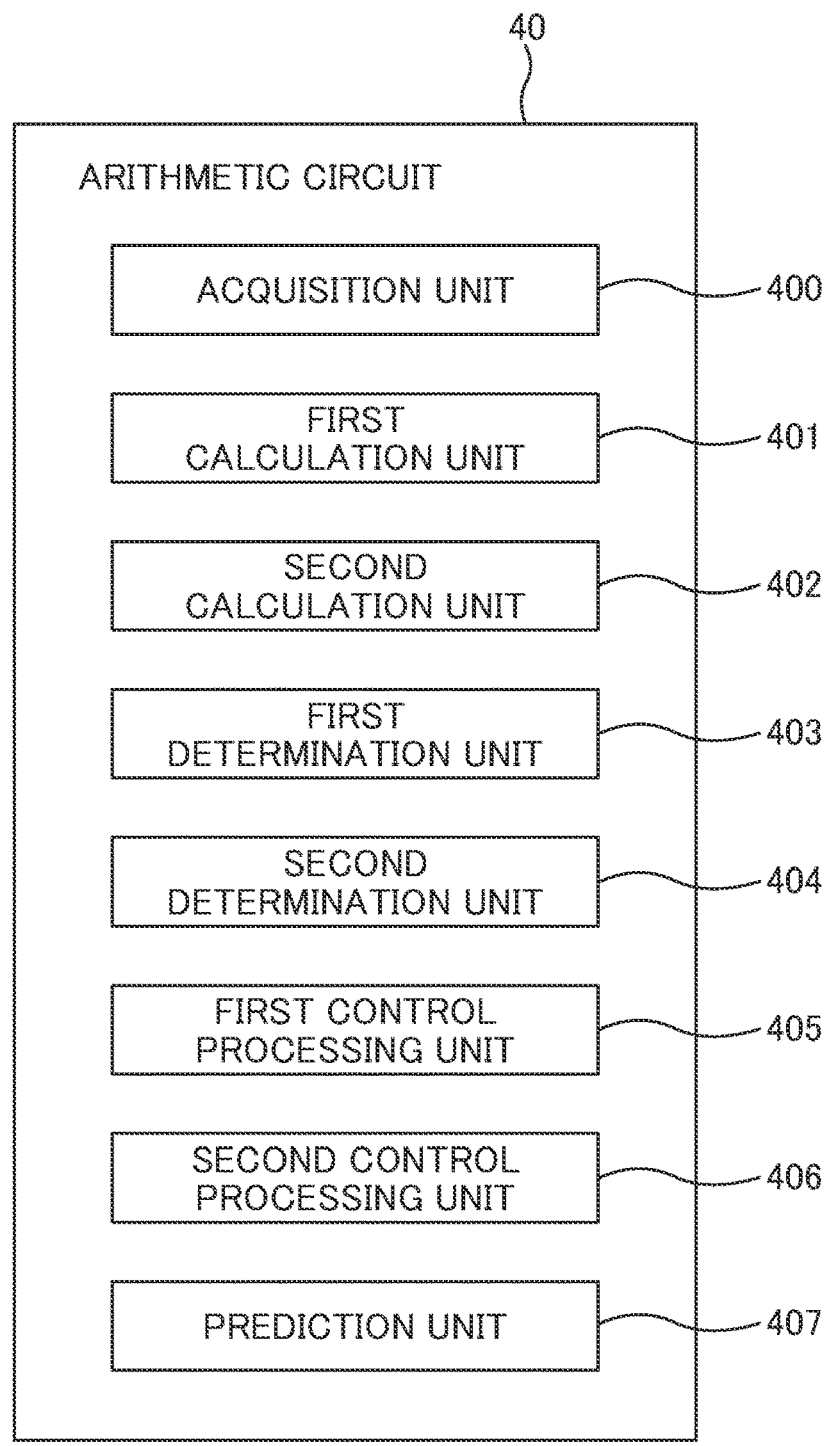
FIG. 2 is a diagram illustrating an example of functional blocks implemented by an arithmetic circuit.

FIG. 2 is a diagram illustrating an example of functional blocks implemented by the arithmetic circuit 40. The arithmetic circuit 40 executes the program, to thereby implement an acquisition unit 400, a first calculation unit 401, a second calculation unit 402, a first determination unit 403, a second determination unit 404, a first control processing unit 405, a second control processing unit 406, and a prediction unit 407.

The acquisition unit 400 executes a process (acquisition process) of acquiring a temperature detected by the first temperature sensor 23 (hereinafter referred to as a first temperature $T_1$) and the temperature of the semiconductor module (hereinafter referred to as a second temperature $T_2$).

In an embodiment of the present disclosure, since two second temperature sensors 24a and 24b are provided, the acquisition unit 400 acquires second temperatures $T_{2a}$ and $T_{2b}$ detected by the respective sensors.

Note that the second temperature $T_2$ does not have to be a temperature detected by the second temperature sensor 24. Instead, the environmental temperature of a facility, such as a factory in which the semiconductor module 2 is placed may be a second temperature $T_{2e}$. In this case, the second temperature sensor 24 may have a given configuration, and the semiconductor module 2 does not have to include the second temperature sensor 24.

The first calculation unit 401 executes a process (first calculation process) of calculating a power consumption $P_d$ of the switching devices of the semiconductor module 2 based on the currents actually flowing through and voltages across the switching devices. A method for calculating the power consumption $P_d$ of the switching devices will be described later in detail.

The second calculation unit 402 executes a process (second calculation process) of calculating the thermal resistance $R_\theta$ between the semiconductor chip and the position of the second temperature sensor 24. In the second calculation process, the second calculation unit 402 calculates the thermal resistance $R_\theta$ based on the first temperature $T_1$, the second temperature $T_2$, and the calculated power consumption $P_d$ of the switching devices.

In an embodiment of the present disclosure, since two second temperature sensors 24a and 24b are provided, the second calculation unit 402 calculates the thermal resistance $R_\theta$ of each of them. The second calculation unit 402 may also calculate the thermal resistance $R_\theta$ based on the environmental temperature (second temperature $T_{2e}$).

Specifically, the thermal resistance $R_\theta$ is calculated using the following relational expression of the first temperature $T_1$, the second temperature $T_{2a}$, the power consumption $P_d$, and the thermal resistance $R_\theta$:

$$T_1 = T_{2a} + P_d \times R_\theta.$$

Hereinafter, a description will be given using the second temperature $T_{2a}$, and the same applies to the second temperature $T_{2b}$ and the second temperature $T_{2e}$.

The first determination unit 403 executes a process (first determination process) of determining whether the thermal resistance $R_\theta$ calculated by the second calculation unit 402 exceeds the first threshold $Th_1$. The first threshold $Th_1$ is a value preset by a user. In an embodiment of the present disclosure, since there are two second temperature sensors 24a and 24b, the second calculation unit 402 calculates the thermal resistance $R_\theta$ of each of them. In an embodiment of the present disclosure, it is determined whether the thermal resistance $R_\theta$ with respect to at least one of the two second temperature sensors 24a and 24b exceeds the first threshold $Th_1$.

The first threshold $Th_1$ is set based on a predetermined reference value. Examples of the reference value include the value of the thermal resistance given in the specifications of the semiconductor module 2, the initial value of the thermal resistance $R_\theta$, and the like. The initial value of the thermal resistance $R_\theta$ is the value of the thermal resistance $R_\theta$ initially calculated by the second calculation unit 402 after the power converter 1 starts being used.

An example of the first threshold $Th_1$ may be a value obtained by adding, to the reference value, a value greater than zero (e.g., a value which is 20% of the initial value of the thermal resistance $R_\theta$). In other words, the first determination unit 403 may determine whether the absolute value of the thermal resistance $R_\theta$ exceeds a predetermined value.

Another example of the first threshold $Th_1$ may be a value obtained by multiplying the reference value by a number greater than 1. In other words, the first determination unit 403 may determine whether a rate of change of the thermal resistance Re relative to the reference value exceeds a predetermined value.

The second determination unit 404 executes a process (second determination process) of determining whether the thermal resistance $R_\theta$ calculated by the second calculation unit 402 exceeds the second threshold $Th_e$ which is greater than the first threshold $Th_1$. In an embodiment of the present disclosure, it is determined whether the thermal resistance $R_\theta$ with respect to at least one of the two second temperature sensors 24a and 24b exceeds the second threshold $Th_2$. The second threshold $Th_2$ is a value preset by a user (e.g., a value obtained by adding, to the reference value, a value that is 30% of the initial value of the thermal resistance $R_\theta$). Similarly to the first threshold $Th_1$, the second threshold $Th_2$ is also set based on the predetermined reference value.

In the case where the calculated thermal resistance $R_\theta$ exceeds the first threshold $Th_1$, the first control processing unit 405 executes a process (first control process) of causing the control signal output circuit 42 to output a control signal for limiting the current of the switching devices. Specifically, when the thermal resistance $R_\theta$ increases, the first control processing unit 405 reduces the maximum duty cycle of the control signal (PWM signal) outputted from the control signal output circuit 42.

Upon receiving this control signal, the drive circuit 21 of the semiconductor module 2 controls driving of the inverter circuit 22 to thereby limit the currents of the switching devices.

Specifically, the drive circuit 21 limits an increase in the duty cycle in the PWM control, and then controls driving of the inverter circuit 22. Accordingly, the first control process is executed to reduce further heat generation of the semiconductor module 2.

In the case where the calculated thermal resistance $R_\theta$ exceeds the second threshold $Th_2$, the second control processing unit 406 executes a process (second control process) of causing the control signal output circuit 42 to output a control signal for stopping the operation of the switching devices. The second control process is executed to stop the power converter 1, before the semiconductor module 2 is broken to cause an abnormal stop of a load, such as the three-phase motor M.

Upon receiving this control signal, the drive circuit 21 of the semiconductor module 2 stops the operation of the switching devices.

The prediction unit 407 predicts the life of the semiconductor module 2 based on a value of the calculated thermal resistance $R_\theta$ according to a change $R_\theta$ (t) over time. Here, $R_\theta$ (t) is the thermal resistance $R_\theta$ at a time t which is before the time when the prediction unit 407 executes the life prediction process.

A specific method for the prediction unit 407 to predict the life of the semiconductor module 2 is as follows. The already-calculated $R_\theta$(t) is extrapolated based on a value thereof according to a change over time, thereby calculating a predicted thermal resistance $R_\theta'(t)$ at a time after the prediction unit 407 executes the life prediction process. Then, the prediction unit 407 predicts, as the time when the semiconductor module 2 should be broken, a time when the time rate of change of the predicted thermal resistance $R_\theta'(t)$ that has been calculated exceeds a predetermined third threshold $Th_3$.

A specific method for calculating the predicted thermal resistance $R_\theta'(t)$ by extrapolating $R_\theta$ (t) will be described. The prediction unit 407 calculates, as a value of the thermal resistance $R_\theta$ corresponding to the change $R_\theta$ (t) over time, the first to n-th order differential coefficients of a thermal resistance $R_\theta$ (t) at a time $t_0$ before the time at which the life prediction process is executed. Here, n is a predetermined integer of 2 or greater.

Then, the prediction unit 407 calculates the predicted thermal resistance $R_\theta'(t)$ at a given future time, by performing a Taylor expansion around the time $t_0$ using the calculated first to n-th order differential coefficient.

<Inverter Circuit>

Figure 3:
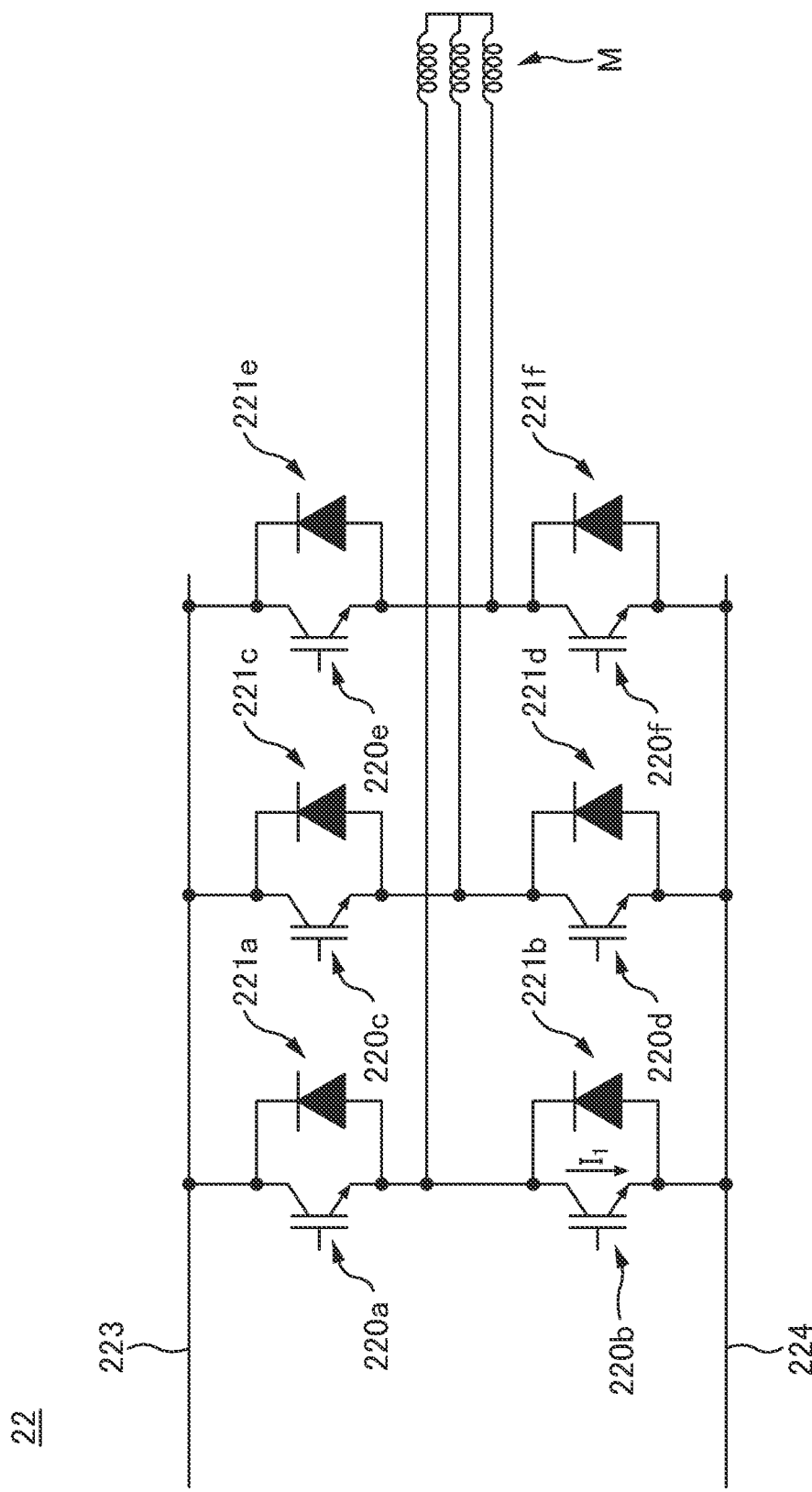
FIG. 3 is a circuitry diagram illustrating an example of an inverter circuit.

The inverter circuit 22 according to an embodiment of the present disclosure will be described in detail with reference to FIG. 3. FIG. 3 is a circuitry diagram illustrating an example of the inverter circuit 22 provided in the semiconductor module 2. The inverter circuit 22 according to an embodiment of the present disclosure is a three-phase PWM inverter circuit 22. The inverter circuit 22 comprises a plurality of insulated gate bipolar transistors (IGBTs) 220a to 220f, a plurality of freewheeling diodes 221a to 221f, a resistor 222, a first power line 223, and a second power line 224. In an embodiment of the present disclosure, the insulated gate bipolar transistors (IGBTs) are used as the switching devices.

Between the first power line 223 and the second power line 224, the first IGBT 220a constituting the upper arm is coupled in series with the first IGBT 220b constituting the lower arm. Similarly, the second IGBT 220c constituting the upper arm is coupled in series with the second IGBT 220d constituting the lower arm, and the third IGBT 220e constituting the upper arm is coupled in series with the third IGBT 220f constituting the lower arm.

The freewheeling diodes 221a to 221f are coupled in anti-parallel to the IGBTs 220a to 220f, respectively.

<Method for Calculating Power Consumption>

Figure 4:
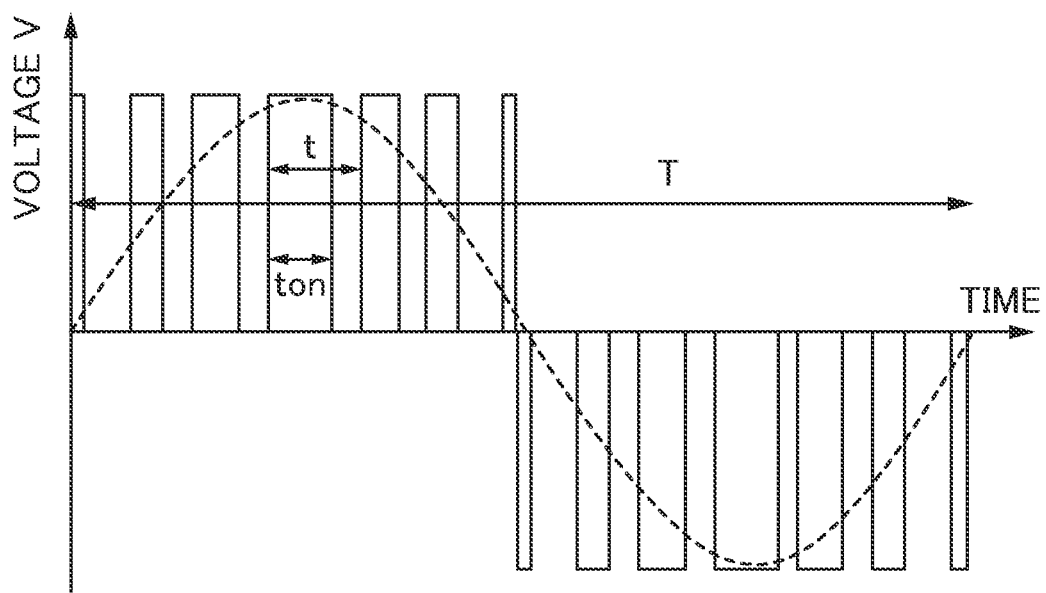
FIG. 4 is a diagram for explaining a PWM signal.

A method for calculating a power consumption according to an embodiment of the present disclosure will be described with reference to FIGS. 3 and 4. FIG. 4 is a diagram for explaining a PWM signal.

In an embodiment of the present disclosure, a power consumption in one rotation cycle T of the three-phase motor M is calculated by obtaining the sum total of power consumptions $P_t$ in ON periods in the rotation cycle T, and then an average power consumption $P_d$ is calculated by dividing the power consumption in the rotation cycle T by the rotation cycle T. In the following, a detailed description will be first given of a method for obtaining the power consumption $P_t$ in an ON period of a PWM signal.

In an embodiment of the present disclosure, a power consumption is calculated based on a current $P_t$ flowing through each of the IGBTs for controlling the current to be supplied to the three-phase motor M and on the collector-emitter resistance of each of the IGBTs during their on-time (on-resistance $R_{ON}$). The value written in the specification of the semiconductor module 2 may be used as the on-resistance $R_{ON}$.

The first calculation unit 401 can calculate the calorific value $C_t$ of each of the IGBTs in an ON period ($t_{on}$) using a following expression:

$$C_t = I_{ave} \times V_{CE} \times t_{on} (I_{ave})^2 \times R_{on} \times t_{on},$$

where $V_{CE}$ is the collector-emitter voltage of each of the IGBTs during their on-time, and $I_{ave}$ is the average value of the current flowing through each of the IGBTs in the ON period. The control circuit 4 changes the duty cycle of the PWM signal, in response to an instruction inputted from the outside, to thereby shape the current $I_1$ flowing through each of the IGBTs into a desired waveform as indicated by the dotted line given in FIG. 4, for example. In other words, the control circuit 4 has information on the current $I_1$ to be passed through each of the IGBTs, and thus the first calculation unit 401 can obtain the average current $I_{ave}$ in the ON period $t_{on}$ based on the information on the current $I_1$ to be passed through each of the IGBTs.

By the method described above, the first calculation unit 401 calculates the power consumption in the rotation cycle T by obtaining the sum total of the calorific values $C_t$ in all the ON periods in the rotation cycle T of the three-phase motor M. Then, the first calculation unit 401 calculates the average power consumption $P_d$ by dividing the power consumption in the rotation cycle T by the rotation cycle T.

Note that, in an embodiment of the present disclosure, the average power consumption $P_d$ is obtained by dividing the calorific value in the rotation cycle T by the rotation cycle T, however, the average power consumption $P_d$ may be the one obtained without dividing the calorific value in the rotation cycle T by the rotation cycle T. In addition, in an embodiment of the present disclosure, the average power consumption $P_d$ is obtained by dividing the power consumption in the rotation cycle T by the rotation cycle T, however, the present disclosure is not limited thereto, and the average power consumption $P_d$ may be obtained, for example, by dividing the power consumption in the half cycle of the rotation cycle T by the half cycle of the rotation cycle T.

Hereinabove, a description has been given of the method for calculating a power consumption, based on the current $I_1$ flowing through each of the IGBTs for controlling the current that is to be supplied to the three-phase motor M and on the on-resistance $R_{ON}$ of each of the IGBTs. Although loss includes a conduction loss and a switching loss, only the conduction loss, which greatly affects change in thermal resistance, is taken into consideration here. The thermal resistance is calculated only based on the power consumption while the IGBTs are conducting here, however, there are actually periods during which freewheeling currents flow through the diodes while the IGBTs are off, and power is consumed in these periods as well. The power consumption while the diodes are conducting can be used together or independently.

In another example, the power consumption may be calculated based on the current $I_1$ flowing through each of the IGBTs for controlling the current that is to be supplied to the three-phase motor M and the collector-emitter voltage $V_{CE}$ of each of the IGBTs during their on-time. This method is useful since the relationship between $I_1$ and $V_{CE}$ of each of the IGBTs is non-linear. Thus, instead of using the above-described on-resistance $R_{ON}$, the voltage $V_{CE}$ can be obtained by applying $I_1$, which is obtained by the above method, to the relationship between $I_1$ and $V_{CE}$ of each of the IGBTs which have been obtained in advance.

<Semiconductor Module>

Figure 5:
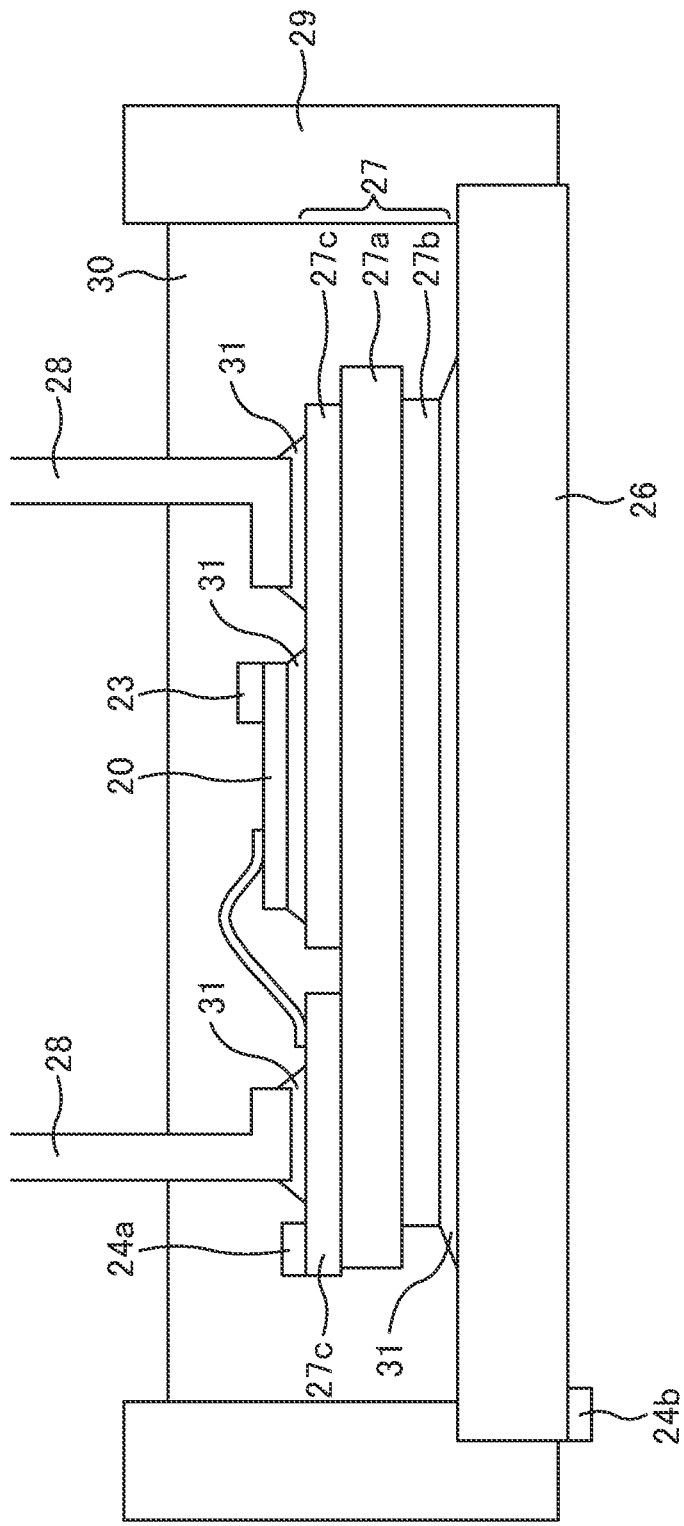
FIG. 5 is a diagram illustrating an example of a configuration of a semiconductor module.

The semiconductor module 2 according to an embodiment of the present disclosure will be described in detail with reference to FIG. 5. FIG. 5 is a diagram illustrating an example of a configuration of the semiconductor module 2.

The semiconductor module 2 comprises a base plate 26, a laminate substrate 27, a semiconductor chip 20, the first temperature sensor 23, the second temperature sensors 24, external terminals 28, a case 29, and a silicone gel 30.

The base plate 26 is a metal plate made of, for example, aluminum, copper, or an alloy containing them. The laminate substrate 27 includes an insulating plate 27a made of, for example, ceramics, a heat dissipation plate 27b provided on the back surface (lower side) of the insulating plate 27a, and a conductive pattern 27c formed on the front surface (upper side) of the insulating plate 27a. The laminate substrate 27 is attached onto the base plate 26 via a bonding material such as solder 31 and/or the like.

The semiconductor chip 20 represents one of chips in which the IGBTs 220a to 220f, the freewheeling diodes 221a to 221f, and the first temperature sensor 23 are formed, and is attached onto the conductive pattern 27c of the laminate substrate 27 via a bonding material such as solder 31. The first temperature sensor 23 is formed integrally with, for example, the IGBTs 220 on the semiconductor chip 20, but is depicted on the front surface of the semiconductor chip 20 for the sake of convenience. In an embodiment of the present disclosure, two second temperature sensors 24 are provided at positions distant from the semiconductor chip 20. One second temperature sensor 24a is provided on the conductive pattern 27c, and the other second temperature sensor 24b is provided on the back surface (lower side) of the base plate 26.

Thus, in an embodiment of the present disclosure, it is possible to monitor the thermal resistance from the semiconductor chip 20 to the second temperature sensor 24a provided on the upper side of an end portion of the insulating plate 27a and the thermal resistance from the semiconductor chip 20 to the second temperature sensor 24b provided on an end portion of the base plate 26, in the semiconductor module 2.

The external terminals 28 are coupled to the semiconductor chip 20 or the conductive pattern 27c via the solder 31. The case 29 is provided on the base plate 26. The laminate substrate 27, the semiconductor chip 20, the first temperature sensor 23, and the second temperature sensor 24a are placed inside the case 29. The silicone gel 30 fills the inside of the case 29 such that part of each of the external terminals 28 is exposed.

<Monitoring of Thermal Resistance>

Figure 6:
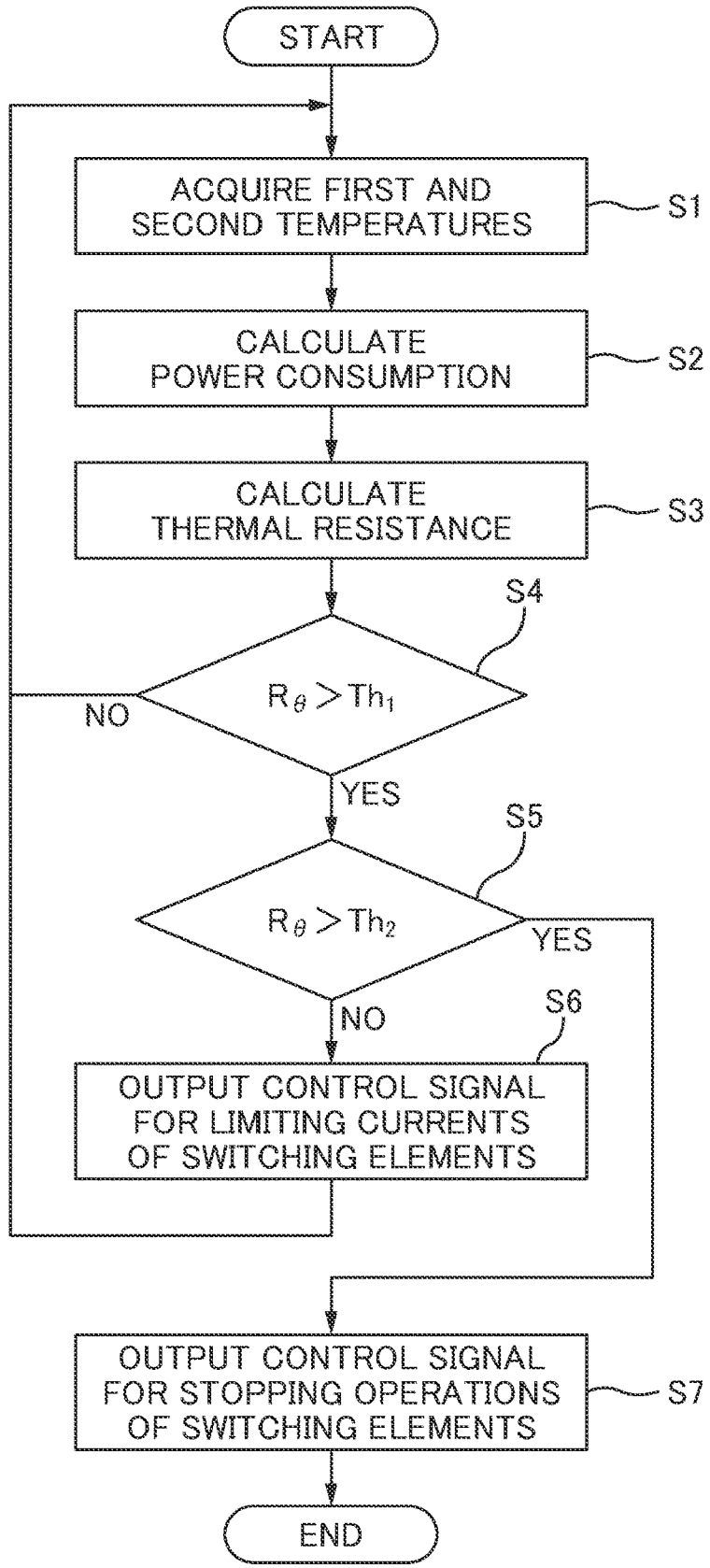
FIG. 6 is a flowchart for explaining a process of monitoring thermal resistance performed by a control circuit.
Figure 7:
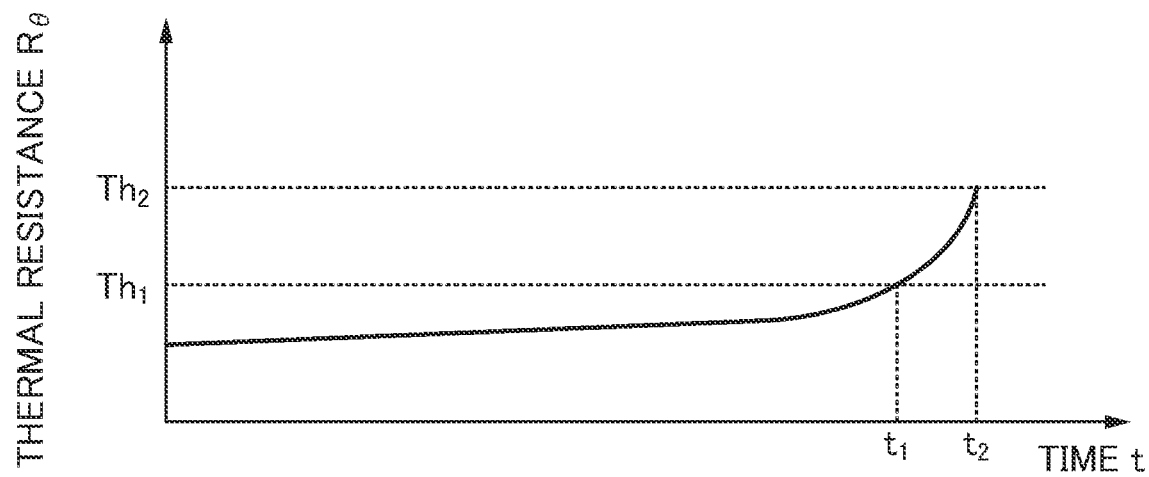
FIG. 7 is a diagram illustrating a transition of monitored thermal resistance.

A process of monitoring the thermal resistance $R_\theta$ using the control circuit 4 will be described with reference to FIGS. 6 and 7. FIG. 6 is a flowchart illustrating the process of monitoring the thermal resistance $R_\theta$ using the control circuit 4. FIG. 7 is a diagram illustrating a transition of the monitored thermal resistance $R_\theta$. Although only monitoring of the thermal resistance from the semiconductor chip to the second temperature sensor 24a will be described below, the same applies to the case of the second temperature sensor 24b as well.

Here, the cycle of a control signal (PWM signal) is 50 psec to several hundred psec. The thermal resistance $R_\theta$ does not necessarily need to be monitored at such a frequency. When the rotation cycle T of the three-phase motor M is, for example, approximately 20 msec, the thermal resistance $R_\theta$ may be monitored every rotation cycle T. The following will describe an aspect in which the thermal resistance $R_\theta$ is monitored every rotation cycle T.

First, in Step S1, the acquisition unit 400 acquires the first temperature $T_1$ and the second temperature $T_{2a}$ (acquisition process).

Next, in Step S2, the first calculation unit 401 calculates the power consumption of the inverter circuit 22 (first calculation process). Specifically, the first calculation unit 401 calculates the power consumptions $P_t$ in all the ON periods in one rotation cycle T. Then, the first calculation unit 401 calculates the average power consumption $P_d$ by obtaining the sum total of the power consumptions $P_t$ in all the ON periods and dividing the sum total by the rotation cycle T.

Next, in Step S3, the second calculation unit 402 calculates the thermal resistance $R_\theta$ of the semiconductor module 2 (second calculation process). Specifically, the second calculation unit 402 calculates the thermal resistance $R_\theta$ using the following relational expression of the first temperature $T_1$, the second temperature $T_{2a}$, the power consumption $P_d$, and the thermal resistance $R_\theta$:

$$T_1 = T_{2a} P_d \times R_\theta.$$

When this second calculation process is the first time, the thermal resistance $R_\theta$ calculated here is obtained as the initial value $R_{\theta ini}$ of the thermal resistance $R_\theta$, and stored in the storage circuit 41.

Next, in Step S4, the first determination unit 403 determines whether the calculated thermal resistance $R_\theta$ exceeds the first threshold $Th_1$ (first determination process). The first threshold $Th_1$ is set using the initial value $R_{\theta ini}$ of the thermal resistance $R_\theta$ obtained in Step S3 as a reference value.

In one example, the first threshold $Th_1$ may be set as follows:

$$Th_1 = R_{\theta ini} + \Delta R_{\theta 1},$$

where $\Delta R_\theta$ is a value greater than 0 (zero) (e.g., a value which is 20% of the initial value of the thermal resistance $R_\theta$).

In another example, the first threshold $Th_1$ may be set as follows:

$$Th_1 = \beta_1 \times R_{\theta ini},$$

where $\beta_1$ is a number greater than 1.

In Step S4, when the thermal resistance $R_\theta$ does not exceed the first threshold $Th_1$ (S4: No), the process returns to Step S1 and continues monitoring. In the example of FIG. 7, the thermal resistance $R_\theta$ rises gently and is lower than or equal to the first threshold $Th_1$, before a time $t_1$.

On the other hand, when the thermal resistance $R_\theta$ exceeds the first threshold $Th_1$ in Step S4 (S4: Yes), the process proceeds to Step S5. In the example of FIG. 7, the thermal resistance $R_\theta$ exceeds the first threshold $Th_1$ at the time $t_1$.

In Step S5, the second determination unit 404 determines whether the calculated thermal resistance $R_\theta$ exceeds the second threshold $Th_2$ (second determination process). Here, the second threshold $Th_2$ is set using the initial value $R_{\theta ini}$ of the thermal resistance $R_\theta$ obtained in Step S3 as a reference value.

In one example, the second threshold $Th_e$ may be set as follows:

$$TH_2 = R_{\theta ini} + \Delta R_{\theta 2},$$

where $\Delta R_{\theta 2}$ is a value greater than $\Delta R_{\theta 1}$ (e.g., a value which is 30% of the initial value of the thermal resistance $R_\theta$).

In another example, the second threshold $Th_2$ may be set as follows:

$$TH_2 \beta_2 \times R_{\theta ini},$$

where $\beta_2$ is a value greater than $\beta_1$.

When the thermal resistance $R_\theta$ does not exceed the second threshold $Th_2$ in Step S5 (S5: No), the process proceeds to Step S6. In Step S6, the first control processing unit 405 causes the control signal output circuit 42 to output a control signal for controlling the current of the switching devices (first control process). As a result, an increase in the rotational speed of the three-phase motor M is controlled, which prevents the thermal resistance $R_\theta$ of the semiconductor module 2 from greatly increasing. This prevents the switching devices (IGBTs 220a to 220f) from being broken due to heat.

When the thermal resistance $R_\theta$ exceeds the second threshold $Th_2$ in Step S5 (S5: Yes), the process proceeds to Step S7. In the example in FIG. 7, the thermal resistance $R_\theta$ exceeds the second threshold $Th_2$ at a time $t_2$. In Step S7, the second control processing unit 406 causes the control signal output circuit 42 to output a control signal for stopping the operations of the switching devices (second control process). This stops the rotation of the three-phase motor M, thereby being able to prevent the switching devices (IGBTs 220a to 220f) from being broken by heat. Then, with the second control process, the control circuit 4 ends the monitoring of the thermal resistance $R_\theta$.

The frequency of executing the process of Steps S1 to S3 is not particularly limited. The control circuit 4 desirably executes the process in these steps at predetermined intervals longer than the switching cycle of the switching devices.

<Modification>

Figure 8:
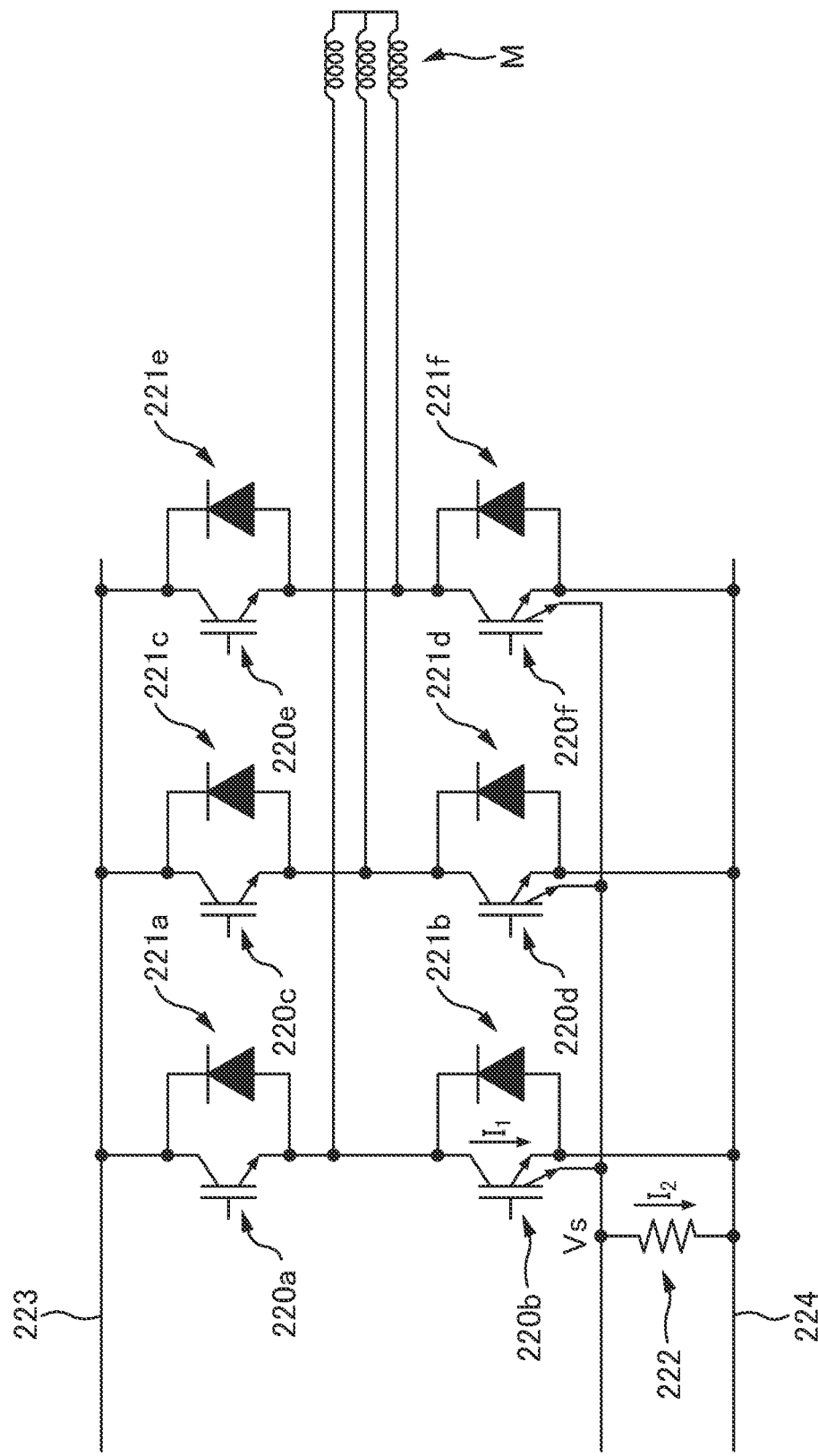
FIG. 8 is a circuitry diagram illustrating an example of an inverter circuit.
Figure 9:
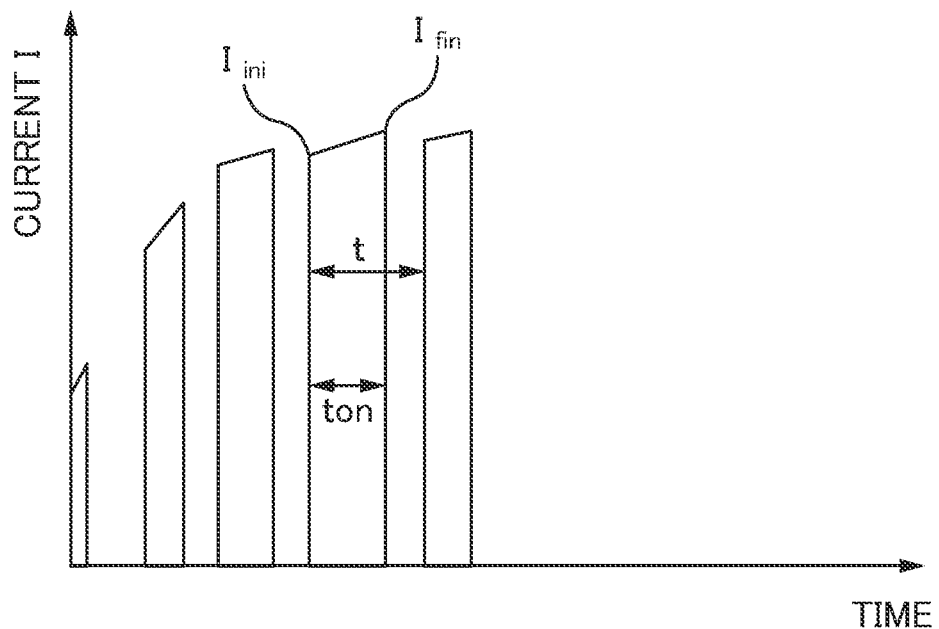
FIG. 9 is a diagram for explaining a current flowing through a switching device under PWM control.

A method for calculating a power consumption according to a modification of the above embodiment will be described with reference to FIGS. 2, 4, 8, and 9. FIG. 8 is a circuitry diagram illustrating a modification of the inverter circuit 22 provided in the semiconductor module 2. FIG. 9 is a diagram for explaining currents flowing through the switching devices under PWM control.

The above embodiment has described an aspect in which the current $I_1$ flowing through each of the IGBTs is acquired from the control circuit 4. A present modification will describe another aspect of acquiring the current $I_1$ flowing through each of the IGBTs.

In the inverter circuit 22 of this modification, the IGBTs 220b, 220d, 220f constituting the lower arm are devices that include a large-sized IGBT for controlling the current that is to be supplied to the three-phase motor M and a small-sized IGBT for current detection.

The resistor 222 illustrated in FIG. 8 is provided to detect a current corresponding to the current $I_1$ flowing through the switching devices (IGBTs 220a to 220f). The first calculation unit 401 implemented by the arithmetic circuit 40 illustrated in FIG. 2 calculates the power consumption $P_d$ of the switching devices based on the voltage across the resistor 222, in the first calculation process. Hereinafter, a description will be given of a method of calculating the power consumption $P_d$ in the first calculation process performed by the first calculation unit 401.

The current $I_1$ flowing through each of the IGBTs for controlling the current that is to be supplied to the three-phase motor M and current $I_2$ flowing through each of the IGBTs for current detection have a relationship such as the expression as follows:

$$I_1 = \alpha \times I_2.$$

The relationship here depends on the relationship between the size of the IGBT for controlling the current that is to be supplied to the three-phase motor M and the size of the IGBT for current detection.

In this modification, the total amount of the current flowing through the IGBTs 220b, 220d, 220f constituting the lower arm flows through the resistor 222, and thus the above relationship also depends on the ratio of distribution of the current flowing through the IGBTs 220b, 220d, 220f constituting the lower arm at each point of time. This ratio of distribution is determined by the control performed by the control circuit 4, and thus can be obtained from the control circuit 4.

The total amount of current I$_2$ flowing through the IGBTs for current detection is supplied to the resistor 222.

Accordingly, a voltage V$_s$ corresponding to the current I$_2$ is generated at the resistor 222. The voltage V$_s$ can be expressed by the following expression:

$$V_s = I_2 \times R = I_1 \times R/\alpha,$$

where R is the resistance value of the resistor 222.

In other words, detection of the voltage V$_s$ makes it possible to obtain the current I$_1$ using the following expression which is a modification of the above expression:

$$I_1 = V_s \times \alpha/R.$$

Accordingly, a transition of the current given in FIG. 9 can be monitored by monitoring the voltage V$_s$. The first calculation unit obtains the voltage V$_s$ outputted from the IF circuit 25 via the IF circuit 43, and calculates an average current I$_{ave}$ in an ON period based on the transition of the current. The average current I$_{ave}$ in an ON period may be, for example, the average between the current I$_{ini}$ at the start of the ON period and a current I$_{fin}$ at the end of the ON period.

Accordingly, the first calculation unit 401 can calculate and obtain the power consumption P$_t$ of each of the IGBTs in the ON period (t$_{on}$) using the following expression:

$$P_t = I_{ave} \times V_{CE} \times t_{on} = (I_{ave})^2 \times R_{on} \times t_{on},$$

where I$_{ave}$ is the average value of the current I$_1$ flowing through each of the IGBTs in the ON period.

By the above method, the first calculation unit calculates the power consumptions P$_t$ in all the ON periods in the rotation cycle T of the three-phase motor M. The first calculation unit calculates the power consumption in the rotation cycle T by obtaining the total sum of the power consumptions P$_t$ in the ON periods in the rotation cycle T. Then, the first calculation unit calculates the average power consumption P$_d$ by dividing the power consumption in the rotation cycle T by the rotation cycle T.

Note that, this modification has described an aspect in which the resistor 222 for current detection is coupled to all the IGBTs 220b, 220d, 220f constituting the lower arm, however, the present disclosure is not limited thereto. Resistors for detecting currents flowing through the respective IGBTs 220b, 220d, 220f may be respectively coupled to the IGBTs 220b, 220d, 220f constituting the lower arm.

In this case, the relationship between the current I$_1$ flowing through each of the IGBTs for controlling the current that is to be supplied to the three-phase motor M and the current I$_2$ flowing through each of the IGBTs for current detection does not depend on the ratio of distribution of the current flowing through the IGBTs 220b, 220d, 220f constituting the lower arm at each point of time.

<Summary>

Hereinabove, the power converter 1 according to an embodiment of the present disclosure has been described. The power converter 1 according to an embodiment of the present disclosure includes: a control circuit 4 that outputs a control signal; and a semiconductor module 2 having a semiconductor chip 20 on which a switching device that is turned on and off in response to the control signal is provided and a first temperature sensor 23 that detects the temperature of the semiconductor chip 20. The control circuit 4 monitors the thermal resistance of the semiconductor module 2 based on a first temperature detected by the first temperature sensor 23, a second temperature indicating the temperature of the semiconductor module 2, and the power consumption of the switching device.

This makes it possible to monitor the thermal resistance of the semiconductor module 2 that changes over time.

In the above power converter 1, the second temperature may be the temperature of an environment where the semiconductor module 2 is placed. This simplifies the configuration of the semiconductor module 2.

In addition, in the above power converter 1, the semiconductor module 2 may further have the second temperature sensor 24 provided at a distance from the semiconductor chip 20, and the second temperature may be a temperature detected by the second temperature sensor 24. This makes it possible to accurately monitor the thermal resistance of the semiconductor module 2 that changes over time.

In addition, in the above power converter 1, the control circuit 4 outputs the control signal for limiting the current of the switching device when the thermal resistance exceeds the first threshold. This can reduce heat generation of the semiconductor module 2 and extend a time period until the semiconductor module 2 is broken.

In addition, in the above power converter 1, when the thermal resistance exceeds the second threshold greater than the first threshold, the control circuit 4 outputs the control signal for stopping the operation of the switching device. This can stop the power converter 1 before the semiconductor module 2 is broken to cause an abnormal stop of a load such as the three-phase motor M.

In addition, in the above power converter 1, the control circuit 4 predicts the life of the semiconductor module 2 based on a value of the thermal resistance according to a change over time. This makes it easy to determine and modify the operation plan of the power converter 1.

In addition, in the above power converter 1, the semiconductor module 2 includes the resistor 222 that detects a current corresponding to a current flowing through the switching device, and the control circuit 4 monitors the thermal resistance using the power consumption of the switching device obtained based on a voltage across the resistor 222. This enables highly accurate calculation of the power consumption of the switching device. Accordingly, it is possible to monitor a thermal resistance calculated with high accuracy.

In addition, in the above power converter 1, the control circuit 4 monitors the thermal resistance at predetermined intervals longer than the switching cycle of the switching device. This reduces the calculation load on the control circuit 4.

In addition, in the above power converter 1, the control circuit 4 includes the arithmetic circuit 40 and the storage circuit 41, and the arithmetic circuit 40 executes an acquisition process of acquiring the first and second temperatures, the first calculation process of calculating the power consumption of the switching device, and the second calculation process of calculating the thermal resistance based on the first and second temperatures and the calculated power consumption of the switching device. This enables calculation of the thermal resistance of the semiconductor module 2 that changes over time.

In addition, in the above power converter 1, the control circuit 4 includes the control signal output circuit 42 that outputs the control signal, and the arithmetic circuit 40 executes the first determination process of determining whether the calculated thermal resistance exceeds the first threshold and the first control process of causing the control signal output circuit 42 to output the control signal for limiting the current to the switching device when the calculated thermal resistance exceeds the first threshold. This can reduce heat generation of the semiconductor module 2 and extend the time period until the semiconductor module 2 is broken.

In addition, in the above power converter 1, the arithmetic circuit 40 executes the second determination process of determining whether the calculated thermal resistance exceeds the second threshold greater than the first threshold, and the second control process of causing the control signal output circuit 42 to output the control signal for stopping the operation of the switching device when the calculated thermal resistance exceeds the second threshold. This can stop the power converter 1 before the semiconductor module 2 is broken to cause an abnormal stop of a load such as the three-phase motor M.

In addition, in the above power converter 1, the arithmetic circuit 40 executes the prediction process of predicting the life of the semiconductor module 2 based on a value of the calculated thermal resistance according to a change over time. This facilitates determination and modification of the operation plan of the power converter 1.

In addition, in the above power converter 1, the semiconductor module 2 includes the resistor 222 that detects a current corresponding to a current flowing through the switching device, and the arithmetic circuit 40 calculates the power consumption of the switching device based on a voltage across the resistor 222, in the first calculation process. This enables highly accurate calculation of the power consumption of the switching device. Accordingly, it is possible to monitor the thermal resistance calculated with high accuracy.

In addition, in the above power converter 1, the arithmetic circuit 40 executes the second calculation process at predetermined intervals longer than the switching cycle of the switching device. This reduces the load on the control circuit 4.

Note that, since the above power converter 1 can include a plurality of second temperature sensors 24, it is possible to monitor thermal resistances of a plurality of paths. Thus, even in a case where the semiconductor module 2 is large in size, the thermal resistance of the semiconductor module 2 can be monitored with high accuracy.

In an embodiment of the present disclosure, the calculated thermal resistance $R_\theta$ itself is used, as a value corresponding to the thermal resistance, to be compared with the first threshold $Th_1$ ($=R_{\theta ini}+\Delta R_\theta$). However, the present disclosure is not limited thereto. For example, a value obtained by subtracting the initial value of the thermal resistance from the calculated thermal resistance may be used as a value corresponding to the thermal resistance to be compared with the threshold ($\Delta R_\theta$). Even in such a case, it is possible to achieve effects similar to the effects in an embodiment of the present disclosure.

Embodiments of the present disclosure described above are simply to facilitate understanding of the present disclosure and are not in any way to be construed as limiting the present disclosure. The present disclosure may variously be changed or altered without departing from its essential features and encompass equivalents thereof.

The present disclosure can provide a power converter capable of monitoring a thermal resistance of a semiconductor module that changes over time.

What is claimed is:

1. A power converter comprising:
a control circuit configured to output a control signal; and
a semiconductor module including
a semiconductor chip,
a switching device provided on the semiconductor chip, the switching device being configured to be turned on and off in response to the control signal, and
a first temperature sensor configured to detect a temperature of the semiconductor chip, wherein
the control circuit is configured to monitor a thermal resistance of the semiconductor module based on
a first temperature detected by the first temperature sensor,
a second temperature corresponding to a temperature of the semiconductor module, and
a power consumption of the switching device; and
the control circuit includes an arithmetic circuit and a storage circuit, the arithmetic circuit executing
an acquisition process of acquiring the first and second temperatures,
a first calculation process of calculating the power consumption of the switching device, and
a second calculation process of calculating the thermal resistance based on the first and second temperatures and the calculated power consumption of the switching device.

2. The power converter according to claim 1, wherein the second temperature is a temperature of an environment in which the semiconductor module is placed.

3. The power converter according to claim 1, wherein the semiconductor module further includes a second temperature sensor provided at a distance from the semiconductor chip, and
the second temperature is detected by the second temperature sensor.

4. The power converter according to claim 1, wherein the control circuit outputs the control signal to limit a current of the switching device when a value corresponding to the thermal resistance exceeds a first threshold.

5. The power converter according to claim 4, wherein the control circuit outputs the control signal to stop an operation of the switching device when the value corresponding to the thermal resistance exceeds a second threshold greater than the first threshold.

6. The power converter according to claim 1, wherein the control circuit predicts a life of the semiconductor module based on a value of the thermal resistance according to a change of the thermal resistance over time.

7. The power converter according to claim 1, wherein the semiconductor module further includes a resistor that detects a current corresponding to a current flowing through the switching device, and
the control circuit monitors the thermal resistance using the power consumption of the switching device obtained based on a voltage across the resistor.

8. The power converter according to claim 1, wherein the control circuit monitors the thermal resistance at a predetermined interval longer than a switching cycle of the switching device.

9. The power converter according to claim 1, wherein the control circuit further includes a control signal output circuit that outputs the control signal, and
the arithmetic circuit further executes
a first determination process of determining whether a value corresponding to the calculated thermal resistance exceeds a first threshold, and
a first control process of causing the control signal output circuit to output the control signal to limit a current of the switching device when the value corresponding to the calculated thermal resistance exceeds the first threshold.

10. The power converter according to claim 9, wherein the arithmetic circuit further executes
- a second determination process of determining whether the value corresponding to the calculated thermal resistance exceeds a second threshold greater than the first threshold, and
- a second control process of causing the control signal output circuit to output the control signal to stop an operation of the switching device when the value corresponding to the calculated thermal resistance exceeds the second threshold.

11. The power converter according to claim 1, wherein the arithmetic circuit further executes a prediction process of predicting a life of the semiconductor module based on a value of the calculated thermal resistance according to a change of the thermal resistance over time.

12. The power converter according to claim 1, wherein the semiconductor module further includes a resistor that detects a current corresponding to a current flowing through the switching device, and
the arithmetic circuit calculates the power consumption of the switching device based on a voltage across the resistor, in the first calculation process.

13. The power converter according to claim 1, wherein the arithmetic circuit executes the second calculation process at a predetermined interval longer than a switching cycle of the switching device.

* * * * *